(12) United States Patent
Jeong et al.

(10) Patent No.: US 11,134,189 B2
(45) Date of Patent: Sep. 28, 2021

(54) IMAGE DEVICE AND OPERATING METHOD THEREOF

(71) Applicant: SAMSUNG ELECTRONICS CO., LTD., Suwon-si (KR)

(72) Inventors: Ji Un Jeong, Seoul (KR); Ki Woon Kim, Hwaseong-si (KR); Chae Ryung Kim, Seoul (KR); Ho Young Kim, Seoul (KR); Eun Seung Yun, Suwon-si (KR); Han Soo Lee, Hwaseong-si (KR); Gyeong Han Cha, Geoje-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 16/743,102

(22) Filed: Jan. 15, 2020

(65) Prior Publication Data

US 2020/0396378 A1 Dec. 17, 2020

(30) Foreign Application Priority Data

Jun. 17, 2019 (KR) .................. 10-2019-0071584

(51) Int. Cl.
*H04N 5/228* (2006.01)
*H04N 5/232* (2006.01)
*H03L 7/18* (2006.01)
*H03L 7/08* (2006.01)

(52) U.S. Cl.
CPC ........... *H04N 5/23227* (2018.08); *H03L 7/08* (2013.01); *H03L 7/18* (2013.01)

(58) Field of Classification Search
CPC .......... H03L 7/08; H03L 7/18; H04N 5/23227

USPC ....................................................... 348/222.1
See application file for complete search history.

(56) References Cited

U.S. PATENT DOCUMENTS

| 7,961,012 | B2 | 6/2011 | Hong et al. |
| 9,524,013 | B2 | 12/2016 | Dreps et al. |
| 2007/0014556 | A1 | 1/2007 | Persson |
| 2011/0096012 | A1 | 4/2011 | Park et al. |
| 2014/0035891 | A1* | 2/2014 | Tanaka ..................... G09G 3/20 345/204 |
| 2015/0102735 | A1* | 4/2015 | Kuo ..................... G09G 3/3677 315/161 |

FOREIGN PATENT DOCUMENTS

| JP | 2010-068414 A | 3/2010 |
| JP | 2012-141730 A | 7/2012 |
| KR | 10-2005-0059384 | 7/2005 |

\* cited by examiner

*Primary Examiner* — Usman A Khan
(74) *Attorney, Agent, or Firm* — Lee IP Law, PC

(57) ABSTRACT

An image device may include a clock generator to generate a first output clock of a first frequency, a link layer to generate a control signal for changing the first frequency and output first parallel data including first frame information, a detector to generate a collision avoidance command to change the first frequency to a second frequency during a vertical blanking time, and a frequency changer to receive the collision avoidance command from the detector and transmit a frequency change command to the link layer. The link layer transmits the control signal to the clock generator based on the frequency change command. The vertical blanking time is a time period from a first time point at which the first parallel data is not output from the link layer to a second time point at which second parallel data is output.

20 Claims, 15 Drawing Sheets

IMAGE DEVICE AND OPERATING METHOD THEREOF

CROSS-REFERENCE TO RELATED APPLICATION

Korean Patent Application No. 10-2019-0071584, filed on Jun. 17, 2019, in the Korean Intellectual Property Office, and entitled: "Image Device and Operating Method Thereof," is incorporated by reference herein in its entirety.

BACKGROUND

1. Field

Embodiments relate to an image device and an operating method thereof.

2. Description of the Related Art

A serial interface method for transmitting serial data is mainly used in interfaces for display devices or image devices. The serial interface method may include a low-voltage differential signaling (LVDS) interface method, a mobile industry processor interface (MIPI) method or the like.

While an MIPI method is one of high-speed operation interfaces, frame data in the MIPI method may be transmitted in real time from a transmitter to a receiver. Thus, frequency interference may occur between a clock frequency of the MIPI and an operating bandwidth for peripheral devices such that electro-magnetic interference (EMI) is caused thereby.

SUMMARY

Embodiments are directed to an image device. The image device may include a clock generator to generate a first output clock of a first frequency; a link layer to generate a control signal for changing the first frequency and output first parallel data including first frame information; a detector to generate a collision avoidance command to change the first frequency to a second frequency during a vertical blanking time, the second frequency being different from the first frequency; and a frequency changer to receive the collision avoidance command from the detector and transmit a frequency change command to the link layer. The link layer may transmit the control signal to the clock generator based on the frequency change command, and the vertical blanking time is a time period from a first time point at which the first parallel data is not output from the link layer to a second time point at which second parallel data is output. The second parallel data may include second frame information subsequent to the first frame information.

Embodiments are directed to an image device. The image device may include a detector to generate a collision avoidance command; a frequency changer to receive the collision avoidance command from the detector and generate a frequency change command; a link layer to receive the frequency change command from the frequency changer, generate a control signal based on the frequency change command, and output first parallel data including first frame information; and a clock generator to receive the control signal from the link layer and generate a first output clock of a first frequency. The first frequency may be changed to a second frequency during a vertical blanking time, the second frequency being different from the first frequency, and the vertical blanking time may be a time period from a first time point at which the first parallel data is not output from the link layer to a second time point at which second parallel data is output. The second parallel data may include second frame information subsequent to the first frame information.

Embodiments are directed to an image device. The image device may include a link layer to generate first parallel data including first frame information, the first parallel data being not generated from a first time point; a first peripheral circuit to operate at a first bandwidth; a clock generator to generate a first output clock of a first frequency; a detector to sense whether there is frequency collision between the first bandwidth and the first frequency and generate a collision avoidance command when the frequency collision is sensed; and a frequency changer to receive the collision avoidance command from the detector and generate a frequency change command to change the first frequency to a second frequency after the first time point. The second frequency may not collide with the first bandwidth.

BRIEF DESCRIPTION OF THE DRAWINGS

Features will become apparent to those of skill in the art by describing in detail exemplary embodiments with reference to the attached drawings in which.

DETAILED DESCRIPTION

The above and other objects, features and advantages of the present disclosure will become more apparent to those of ordinary skill in the art by describing in detail exemplary embodiments thereof with reference to the accompanying drawings.

Figure 1:
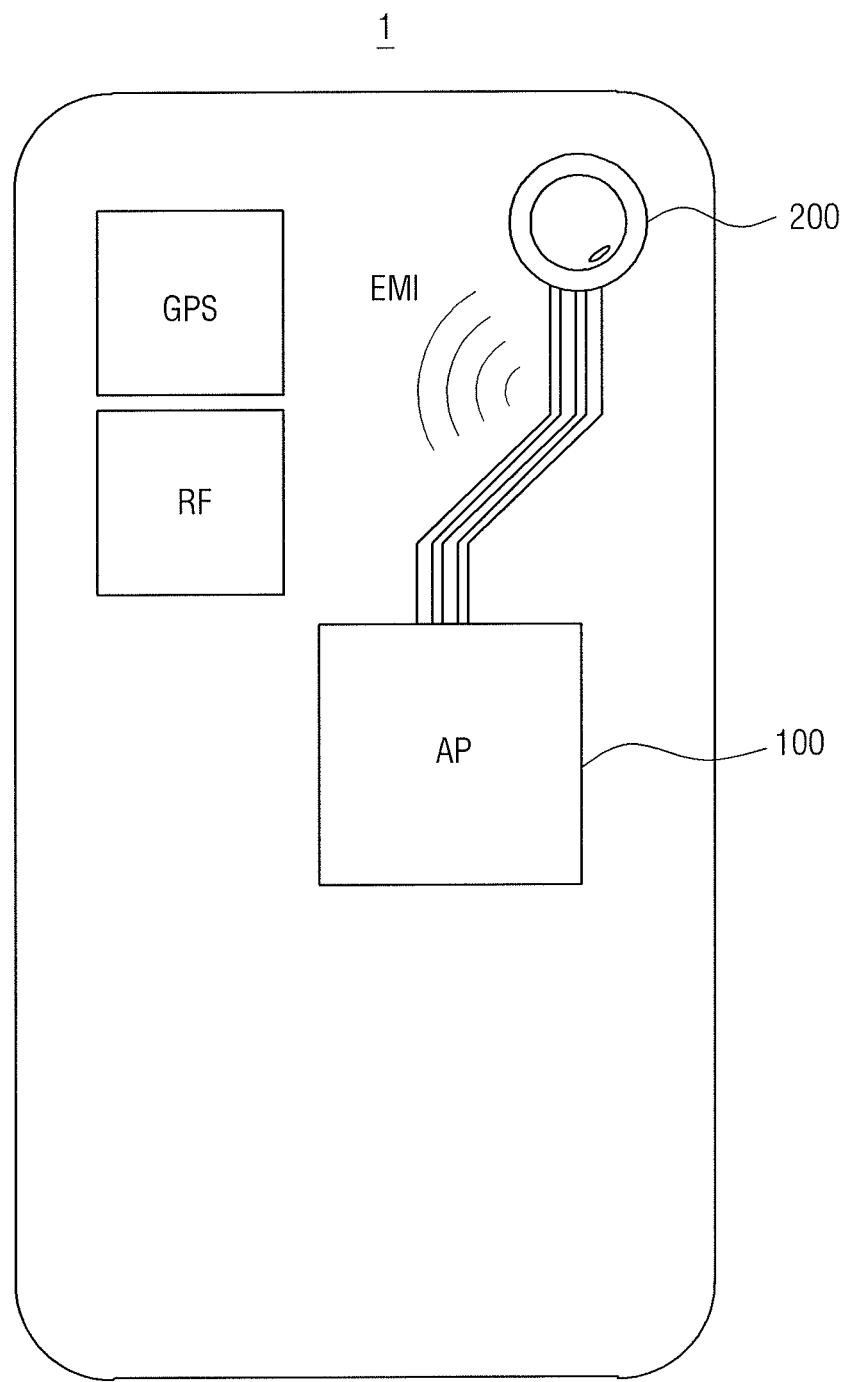
FIG. 1 illustrates an example of a mobile device for explaining electro-magnetic interference (EMI).
Figure 2:
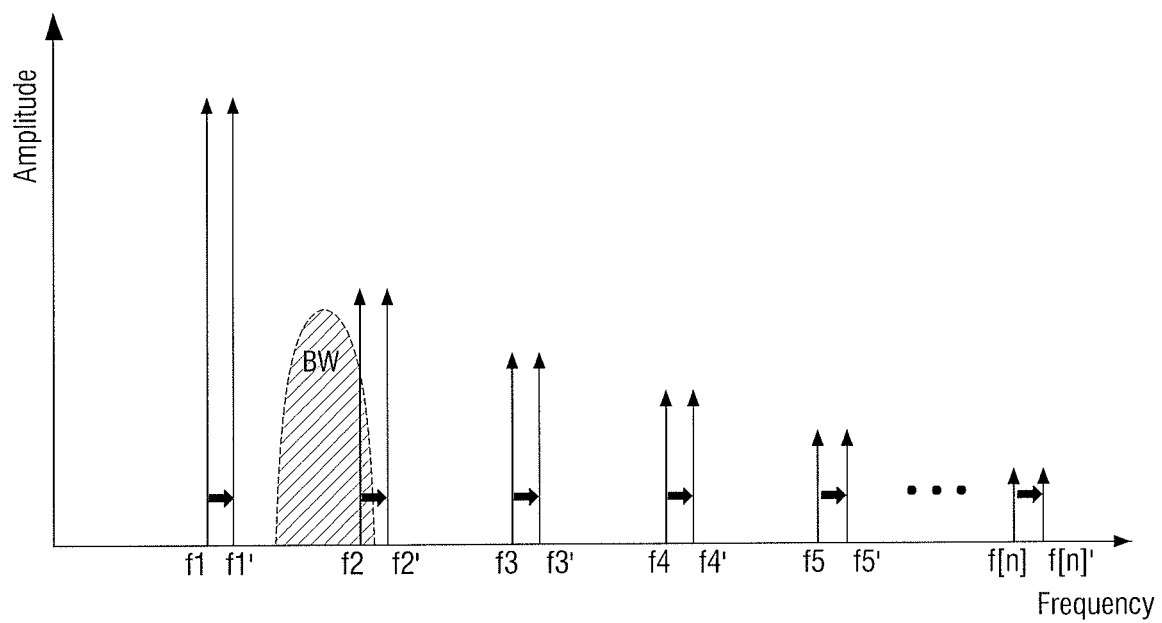
FIG. 2 illustrates a graph for explaining a method of preventing EMI according to some embodiments.

FIG. 1 illustrates an example of a mobile device for explaining electro-magnetic interference (EMI). FIG. 2 illustrates a graph for explaining a method of preventing EMI according to some embodiments.

Referring to FIG. 1, a mobile device 1 may be capable of using a multi-band and may transmit or receive data via an interface for a high-speed data transmission between an image sensor 200 and an application processor (AP) 100. A device capable of using a multi-band may include various portable electronic devices, e.g., the mobile device 1 in FIG. 1, a laptop computer, a cellular phone, a smart phone, a tablet PC, a personal digital assistant (PDA), an enterprise digital assistant (EDA), a digital still camera, a digital video camera, a portable multimedia player (PMP), a personal/portable navigation device (PND), a handheld game console, an e-book, or the like.

For example, the mobile device 1 may include peripheral circuits, e.g., a global positioning system (GPS) circuit for location information management and/or a radio frequency (RF) circuit for radio frequency utilization. The peripheral circuits may operate in bandwidths thereof. Further, the mobile device may include other peripheral circuits. The interface for a high-speed data transmission may include, e.g., a mobile industry processor interface (MIPI) interface. The MIPI may be one of serial interface standards for connection between the application processor (AP) 100 and the peripheral devices and may be an interface standard defined by an MIPI alliance. an MIPI D-PHY may be a high-speed digital serial interface. an MIPI D-PHY display serial interface (DSI) and a camera serial interface (CSI) may be D-PHY-based protocol standard specifications related to displays and cameras.

The image sensor 200 and the application processor (AP) 100 may exchange data with each other according to MIPI standards (e.g., MIPI alliance specifications for D-PHY). For example, interfaces described below (e.g., a first interface and/or a second interface) may be MIPI interfaces.

The image sensor 200 and the application processor (AP) 100 may operate at a frequency of an output clock generated by a clock generator included in the image sensor 200. For example, electro-magnetic interference (EMI) may occur due to a frequency interference between the frequency of the output clock and the operating bandwidths of the peripheral circuits in the mobile device 1. This will be described in detail with reference to FIGS. 1 and 2 below.

Referring to FIGS. 1 and 2, a fundamental frequency f1 may be used for communication between the image sensor 200 and the application processor (AP) 100. Further, a plurality of frequency of f2 to f[n] may be a plurality of harmonic frequency components that are generated due to the fundamental frequency f1 and correspond to integer-multiples of the fundamental frequency f1. The plurality of harmonic frequency components f2 to f[n] may be generated due to the non-linearity of the devices included in the mobile device 1, e.g., a global positioning system (GPS), a radio frequency (RF) circuit, the image sensor 200, and the application processor (AP) 100 in FIG. 1.

For example, the mobile device 1 may be capable of using multi-bands, and the operating bandwidths of the peripheral circuits of the mobile device 1 may vary. For example, when the mobile device 1 is moved to different long-distance regions, the operating bandwidths of the peripheral circuits may vary. For example, EMI may occur when the second harmonic component f2 collides or overlaps with the bandwidth (hatched portion) used by some of the peripheral circuits (e.g., the RF circuit).

For example, when the image sensor 200 and the application processor (AP) 100 exchange data at the fundamental frequency f1, electromagnetic waves may be generated and cause undesired noise. Thus, the peripheral circuits may not operate properly by the undesired noise. For example, EMI generated when the image sensor 200 and the application processor (AP) 100 communicate with each other may interfere with operations of the peripheral circuits.

For example, in order to remove noise due to EMI, the fundamental frequency f1 may be changed to deviate from the colliding bandwidth (the hatched portion). The fundamental frequency f1 and the plurality of harmonic components f2 to f[n] may be changed to a fundamental frequency f1' and a plurality of harmonic components f2' to f[n]'. For example, the plurality of harmonic components f2 to f[n] may be changed due to the changing or shifting of the fundamental frequency f1. Thus, the colliding bandwidth (the hatched portion) may be removed by the deviation of the fundamental frequency f1.

For example, the image sensor 200 may include a phase-locked loop (PLL) circuit that will be described below. For example, the phase-locked loop (PLL) circuit may be reset to change the fundamental frequency f1 used for the communication between when the image sensor 200 and the application processor (AP) 100.

However, when a user of the mobile device 1 uses the image sensor 200 in real time for, e.g., Internet live broadcasting or a video call, applications using the image sensor 200 in the mobile device 1 may be stopped when the PLL circuit is reset. Thus, the user of the mobile device 1 may not use the applications using the image sensor 200 in real time when the fundamental frequency f1 is changed.

According to some embodiments, an image device may be capable of changing the fundamental frequency f1 used for communication between the image sensor 200 and the application processor (AP) 100 during a vertical blanking time VBLANK. Thus, the fundamental frequency f1 used for the communication between the image sensor 200 and the application processor (AP) 100 may be changed without resetting the PLL circuit. As a result, the image device may be used seamlessly or continuously in real-time when the fundamental frequency f1 is changed. Therefore, an operating performance of the image device may be improved by changing the fundamental frequency f1 to deviate from the colliding bandwidth in the vertical blanking time VBLANK without resetting the PLL circuit of the image sensor 200.

The vertical blanking time VBLANK will be described below. For example, display synchronization may be required to display an image on a display of the mobile device 1. The display synchronization may include synchronizing an image from a frame buffer of a graphics processing unit (GPU) in the mobile device 1 with an image output from the display, e.g., a screen of the mobile device 1.

For example, regarding a display method of the display of the mobile device 1, the display of the mobile device 1 may receive 60 image frames from the GPU per second to update an image on the display of the mobile device 1. However, when the image frames are updated by the GPU during reception of the image frames by the display of the mobile device 1, a tearing phenomenon may occur. The tearing phenomenon may include displaying part of the image output to the display of the mobile device 1 abnormally. For example, when the updating the image frame by the GPU and the reception of the image frame by the display of the mobile device 1 are not synchronized, the display of the mobile device 1 may display the image abnormally.

For example, a vertical synchronization signal Vsync may be used to prevent the tearing phenomenon. For example, the GPU may update the image frames after receiving the vertical synchronization signal Vsync. The display of the mobile device 1 may not access the GPU during the updating of the image frames. For example, the vertical blanking time VBLANK may correspond to a time when the display of the mobile device 1 does not access the GPU after the generation of the vertical synchronization signal Vsync. For example, the vertical blanking time VBLANK may include a time from the generation of the vertical synchronization signal Vsync to the updating of the image frame by the GPU.

Figure 3:
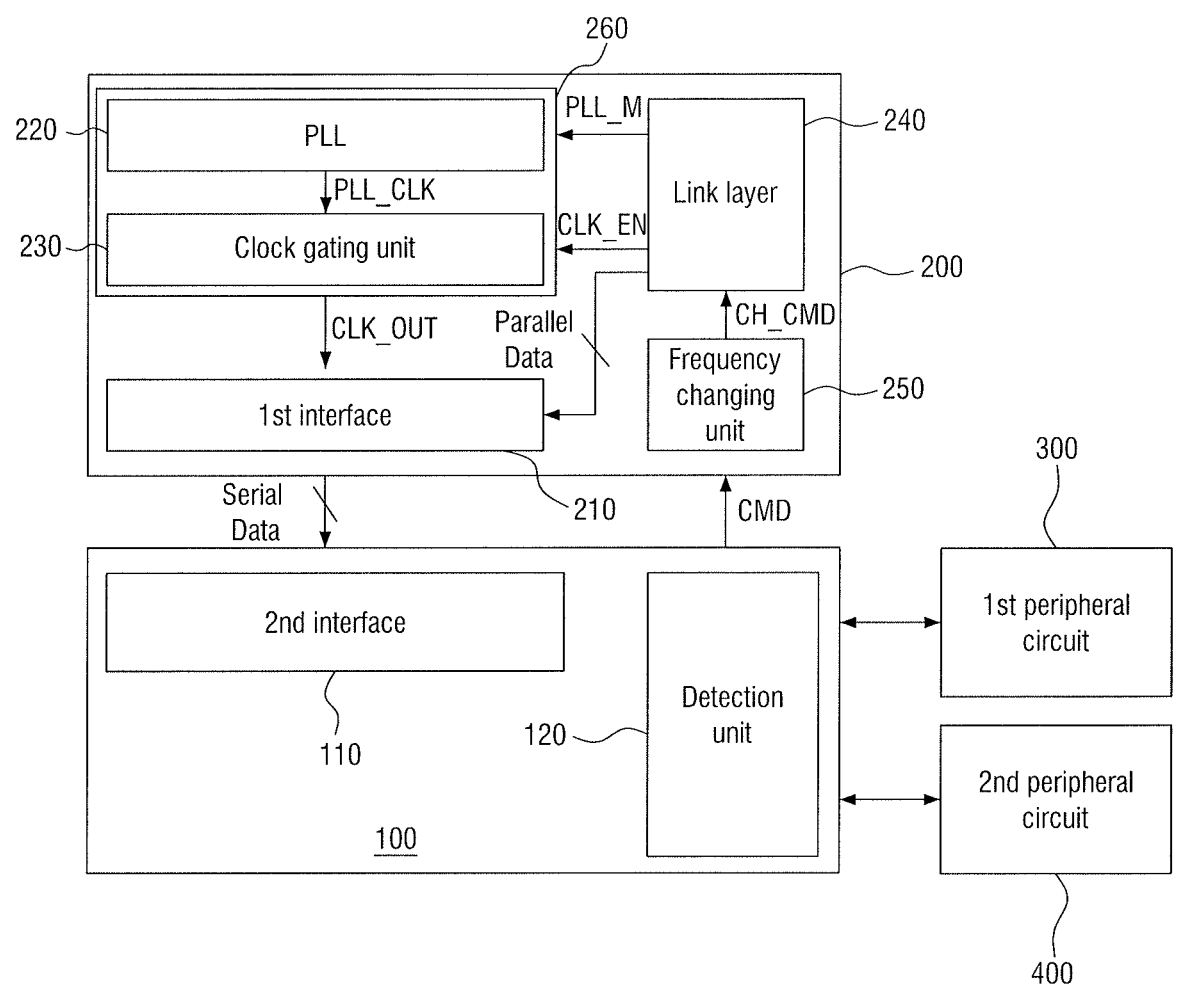
FIG. 3 illustrates an image device according to an example embodiment.
Figure 4:
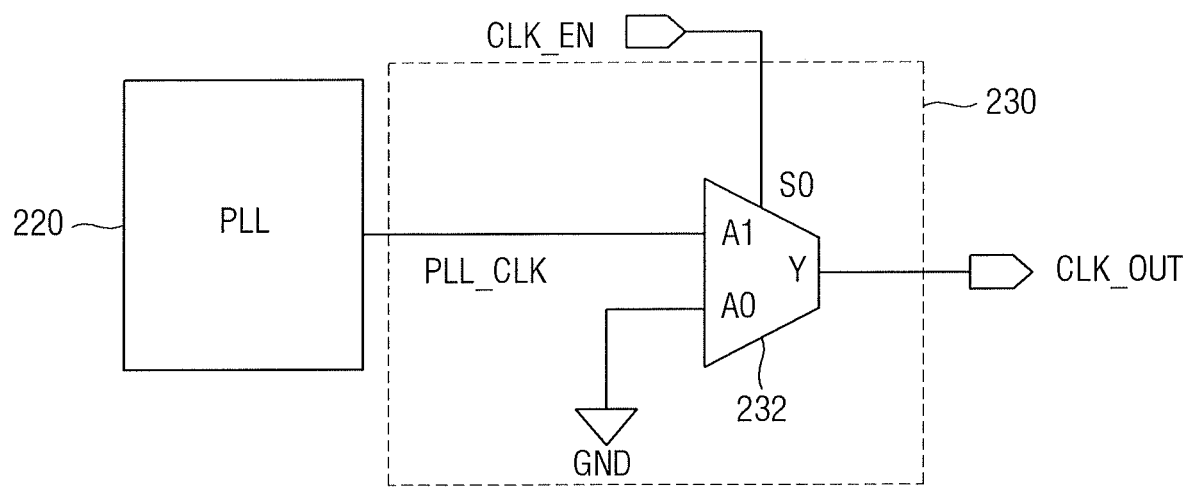
FIG. 4 illustrates a clock gating unit of an image device according to an embodiment.
Figure 5:
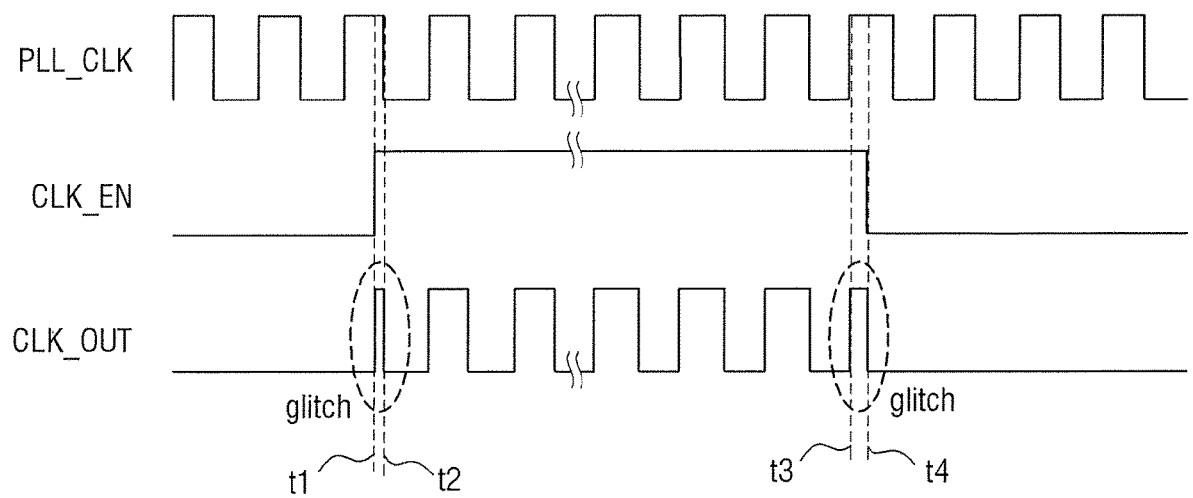
FIG. 5 illustrates a timing chart for explaining an operation of the clock gating unit in FIG. 4.
Figure 6:
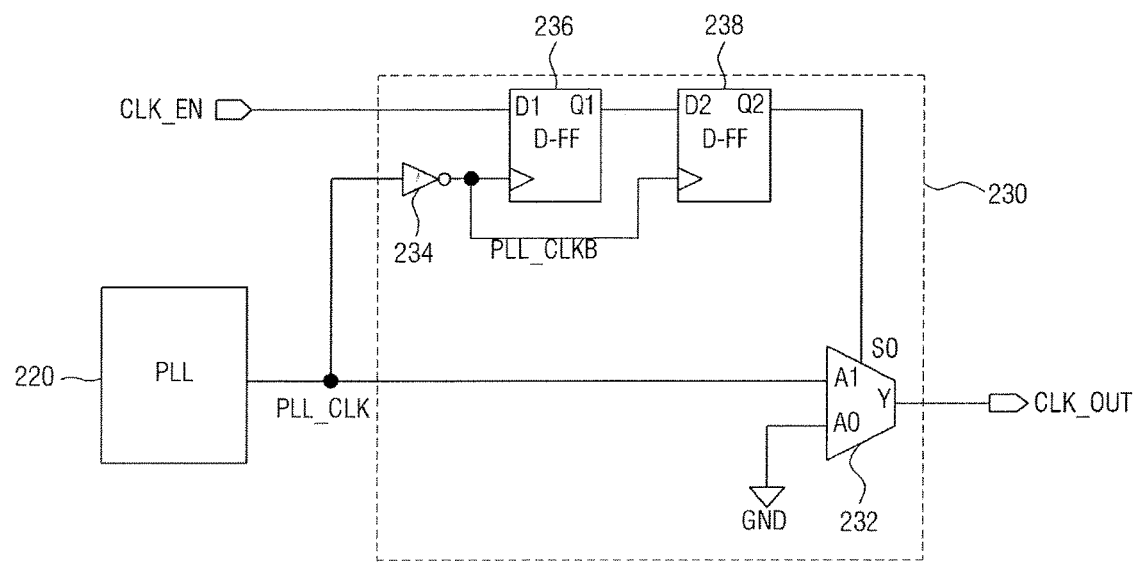
FIG. 6 illustrates a clock gating unit of an image device according to some embodiments.
Figure 7:
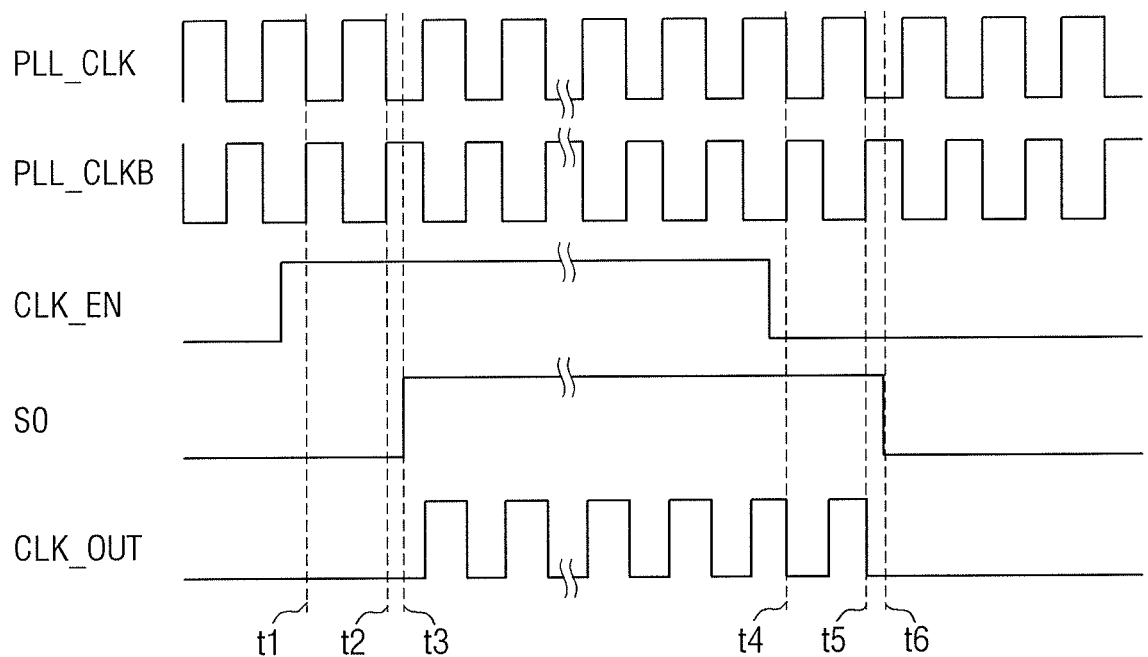
FIG. 7 illustrates a timing chart for explaining an operation of the clock gating unit in FIG. 6.
Figure 8:
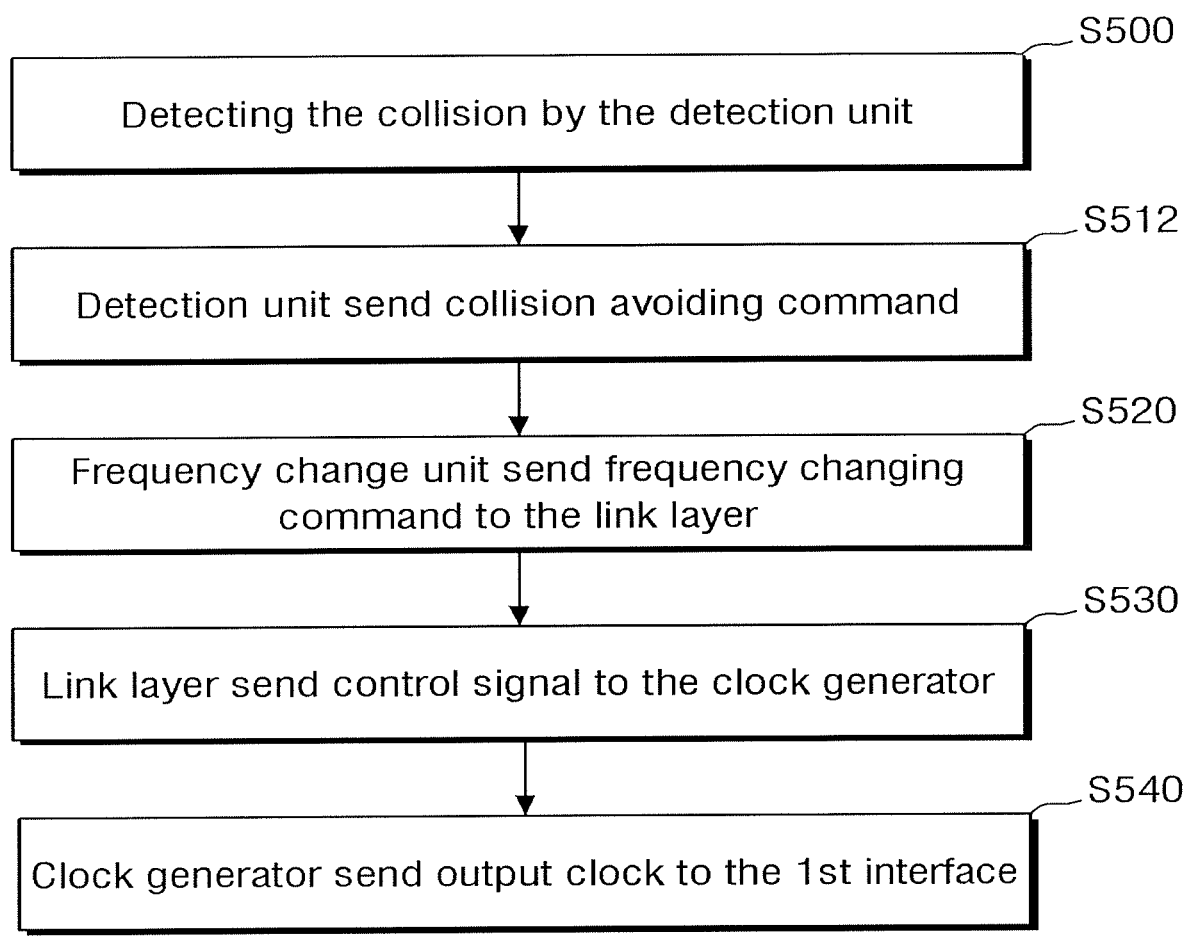
FIG. 8 illustrates s a flow chart for illustrating an operating method of an image device according to an example embodiment.

An image device capable of changing the fundamental frequency f1 during the vertical blanking time VBLANK and an operating method thereof will be described below. FIG. 3 illustrates an image device according to an example embodiment. FIG. 4 illustrates a diagram illustrating a clock gating unit of an image device according to an example embodiment. FIG. 5 illustrates a timing chart for explaining an operation of the clock gating unit in FIG. 4. FIG. 6 illustrates a clock gating unit of an image device according to another embodiment. FIG. 7 illustrates a timing chart for explaining an operation of the clock gating unit in FIG. 6. FIG. 8 illustrates a flow chart for illustrating an operating method of an image device according to an example embodiment.

Referring to FIG. 3, according to some embodiments, an image device may include an image sensor 200, an application processor (AP) 100, a first peripheral circuit 300, and a second peripheral circuit 400. The image sensor 200 may include a frequency changing unit 250, a link layer 240, a clock generator 260, and a first interface 210. The clock generator 260 may include a PLL circuit 220 and a clock gating unit 230.

The PLL circuit 220 may output a PLL clock PLL_CLK with a first frequency. The first frequency of the PLL clock PLL_CLK may be changed by a frequency division control signal PLL_M received from the link layer 240. The clock gating unit 230 may block the PLL clock PLL_CLK received from the PLL circuit 220 to reduce power consumption in a synchronization circuit. For example, when an operation of a specific circuit is not necessary, unnecessary power consumption of the specific circuit may be prevented by blocking the PLL clock PLL_CLK from being transferred to the specific circuit.

For example, the clock gating unit 230 may receive the PLL clock PLL_CLK from the PLL circuit 220, may receive a clock enable signal CLK_EN from the link layer 240, and may output the PLL clock PLL_CLK as an output clock CLK_OUT when the clock enable signal CLK_EN is activated. Further, the clock gating unit 230 may not output the PLL clock PLL_CLK as the output clock CLK_OUT when the clock enable signal CLK_EN is deactivated.

The link layer 240 may control the clock generator 260. For example, when the clock generator 260 generates the output clock CLK_OUT with the first frequency, the first interface 210 may operate at the first frequency of the output clock CLK_OUT. Further, a second interface 110 may operate at the first frequency at which the first interface 210 operates.

Further, the link layer 240 may output parallel data to the first interface 210 for data transmission, where m is an integer greater than or equal to 1. For example, the parallel data may be (m+1)-bit. The first interface 210 may convert the parallel data into serial data and output the serial data. For example, the first interface 210 may convert parallel data input in units of k bits into serial data, where k is an integer greater than or equal to 2.

The application processor (AP) 100 may include the second interface 110 and a detection unit 120. The application processor (AP) 100 may receive serial data from the image sensor 200 via the second interface 110. The Parallel data and the serial data may include image frame information.

The serial data may be a unidirectional or bi-directional signal. According to some embodiments, the serial data may be a unidirectional serial signal transmitted from the image sensor 200 to the application processor (AP) 100.

The detection unit 120 may identify whether the first frequency at which the application processor (AP) 100 operates and a first bandwidth at which the first peripheral circuit 300 operates collide or overlap with each other, and/or whether the first frequency and a second bandwidth at which the second peripheral circuit 400 operate collide or overlap with each other. For example, the identification of the detection unit 120 regarding frequency collision may vary depending on the type and number of peripheral circuits.

The first peripheral circuit 300 may be, e.g., an RF circuit. The second peripheral circuit 400 may be, e.g., a GPS circuit. For example, the first bandwidth at which the first peripheral circuit 300 operates and the first frequency at which the application processor (AP) 100 operates may collide with each other. For example, the detection unit 120 may generate a collision avoidance command CMD to change the first frequency to a second frequency when the first bandwidth at which the first peripheral circuit 300 operates and the first frequency at which the application processor (AP) 100 operates collide or overlap with each other. For example, the second frequency may not collide with the first bandwidth and may be different from the first frequency.

The frequency changing unit 250 may receive the collision avoidance command CMD from the detection unit 120 and transmit a frequency change command CH_CMD including frequency change sequence information to the link layer 240. The first frequency at which the application processor (AP) 100 operates may be changed to the second frequency based on the frequency change command CH_CMD. For example, the frequency change sequence information included in the frequency change command CH_CMD may be set such that the first frequency may be changed to the second frequency during the vertical blanking time VBLANK.

When the link layer 240 receives the frequency change command CH_CMD from the frequency changing unit 250, the link layer 240 may transmit a control signal to the clock generator 260. The control signal may include signals for changing a frequency of the output clock CLK_OUT generated by the clock generator 260. The control signal may include the frequency division control signal PLL_M and the clock enable signal CLK_EN.

A frequency division ratio of a main frequency divider of the PLL circuit 220 of the clock generator 260 may be adjusted by the frequency division control signal PLL_M. When the frequency division ratio of the main frequency divider is adjusted by the frequency division control signal PLL_M, the PLL circuit 220 may output the PLL clock PLL_CLK with the second frequency to the clock gating unit 230 based on the adjusted frequency division ratio.

According to some embodiments, the frequency of the PLL clock PLL_CLK may be changed by adjusting a factor other than the frequency division ratio of the main frequency divider of the PLL circuit 220, but it will be described that the frequency of the PLL clock PLL_CLK is changed by adjusting the frequency division ratio of the main frequency divider in the PLL circuit 220.

The clock gating unit 230 may receive the PLL clock PLL_CLK with the second frequency, receive the clock enable signal CLK_EN from the link layer 240, and output the PLL clock PLL_CLK when the clock enable signal CLK_EN is activated. The clock gating unit 230 may not output the PLL clock PLL_CLK when the clock enable signal CLK_EN is deactivated. For example, the clock gating unit 230 may output the output clock CLK_OUT by controlling the PLL clock PLL_CLK based on the clock enable signal CLK_EN.

A glitch may occur when the PLL clock PLL_CLK is controlled based on the clock enable signal CLK_EN by the clock gating unit 230. The glitch may be an unintended noise pulse generated when the PLL clock PLL_CLK is output as the output clock CLK_OUT through the clock gating unit 230. A glitch caused by the clock gating unit 230 and a configuration and an operation for removing the glitch will be described with reference to FIGS. 4 to 7 below.

Referring to FIG. 4, according to some embodiments, the clock gating unit 230 may include a selector 232. The selector 232 may receive a PLL clock PLL_CLK via a first input selection terminal A1, include a second input selection terminal A0 connected to a ground terminal, and output an output clock CLK_OUT via a final output terminal Y. For example, glitch may occur during the operation of the selector 232. The glitch will be described by way of example with reference to FIGS. 4 and 5 below.

Referring to FIGS. 4 and 5, a PLL clock PLL_CLK may be input to the first input selection terminal A1 from the PLL circuit 220. The selector 232 may output the PLL clock PLL_CLK to the final output terminal Y when a clock enable signal CLK_EN is a logic high. The selector 232 may output a ground signal, which is connected to the second input selection terminal A0, to the final output terminal Y when the clock enable signal CLK_EN is a logic low. A glitch may occur at a first time point t1 at which the clock enable signal CLK_EN is a logic high and a fourth time point t4 at which the clock enable signal CLK_EN is a logic low.

Referring to FIG. 5, the clock enable signal CLK_EN may be changed from a logic low to a logic high at the first time t1. For example, when the clock enable signal CLK_EN is activated (e.g., a logic high) at the first time point t1, the selector 232 may output the PLL clock PLL_CLK to the final output terminal Y as the output clock CLK_OUT. Further, the PLL clock PLL_CLK may be changed from a logic high to a logic low at a second time point t2. The output clock CLK_OUT may be changed from a logic high to a logic low according to the transition of the PLL clock PLL_CLK at the second time point t2. Thus, a first glitch may occur between the first and second time points t1 and t2.

Further, the glitch between the first and second time points t and t2 may be a noise pulse. For example, when the clock enable signal CLK_EN is activated, frequency information of the PLL clock PLL_CLK may be output as the output clock CLK_OUT without being distorted. However, information regarding a time period from the first time point t1 to the second time point t2 information may be different from that of a cycle of the frequency of the PLL clock PLL_CLK. Thus, the output clock CLK_OUT may include distorted frequency information due to the first glitch between the first and second time points t1 and t2.

Further, a second glitch may occur in a time period from a third time point t3 to the fourth time point t4 for a similar reason why the first glitch between the first and second time points t1 and t2 is occurred as described above. According to some embodiments, when the output clock CLK_OUT includes a glitch, an image device may malfunction and thus glitches may be removed to prevent a malfunction of the image device.

A resistor-capacitor (R-C) delay method using a resistor and a capacitor, a capacitor-current charging method, or the like may be used to remove glitches in an integrated circuit. However, such a method may remove glitches with short widths, e.g., microsecond widths, but may not remove glitches with long widths, e.g., millisecond widths, or more. Further, when the R-C delay method using a resistor and a capacitor or the capacitor-current charging method are used to remove glitches, price competitiveness due to an increase in chip size and manufacturing costs may not be secured, because large-scale capacitors are provided inside a chip. Thus, when glitches are removed using a logic circuit as illustrated in FIG. 6, the glitches may be effectively removed with minimizing chip size. A structure and an operation of the clock gating unit 230 configured to eliminate glitches will be described with reference to FIGS. 6 and 7 below.

Referring to FIG. 6, in some embodiments, the clock gating unit 230 may include an inverter 234, a first flip-flop 236, a second flip-flop 238, and a selector 232. The inverter 234 may receive a PLL clock PLL_CLK from a PLL circuit 220 and output an inverted PLL clock PLL_CLKB.

The first flip-flop 236 may receive a clock enable signal CLK_EN via a first input terminal D1, be synchronized with the inverted PLL clock PLL_CLKB, and transmit a signal received via the first input terminal D1 to a first output terminal Q1 at an edge of the clock enable signal CLK_EN. It will be described hereinafter that each of the first flip-flop 236 and the second flip-flop 238 transmits a signal received via an input terminal to an output terminal at a rising edge of the clock enable signal CLK_EN.

The second flip-flop 238 may receive a signal output from the first output terminal Q1 of the first flip-flop 236 via a second input terminal D2, be synchronized with the inverted PLL clock PLL_CLKB, and transmit the signal received via the second input terminal D2 to a second output terminal Q2 at a rising edge of the clock enable signal CLK_EN.

The selector 232 may receive the PLL clock PLL_CLK from the PLL circuit 220 via the first input selection terminal A1, include the second input selection terminal A0 connected to a ground terminal GND, and output a signal as the output clock CLK_OUT. The signal as the output clock CLK_OUT may be selected from among the signals, which are received via the first input selection terminal A1 and the second input selection terminal A, via the final output terminal Y. For example, the selector 232 may select one of the signals from the first input selection terminal A1 and the second input selection terminal AG and output the selected signal to the final output terminal Y based on a signal input via a selection terminal S0 as the signal output from the second output terminal Q2 of the second flip-flop 238.

An operation for removing glitches through the configuration in FIG. 6 will be described with reference to FIG. 7 below. Referring to FIGS. 6 and 7, the PLL clock PLL_CLK and the inverted PLL clock PLL_CLKB may have opposite phases.

The first flip-flop 236 may transmit a signal from the first input terminal D1 to the first output terminal Q1. The second flip-flop 238 may transmit a signal from the second input terminal D2 to the second output terminal Q2 when the inverted PLL clock PLL_CLKB is a rising edge. For example, when the clock enable signal CLK_EN is maintained at a logic low level, the clock enable signal CLK_EN input to the first input terminal D1 of the first flip-flop 236 at a rising edge of the inverted PLL clock PLL_CLKB may be a logic low. Thus, a signal output via the second output terminal Q2 of the second flip-flop 238 may be also maintained at the logic low level.

Referring to FIGS. 6 and 7, when the inverted PLL clock PLL_CLKB may have a rising edge at a first time point t1, the clock enable signal CLK_EN is maintained at a logic high level. Thus, the clock enable signal CLK_EN input to the first input terminal D1 of the first flip-flop 236 may be transmitted to the first output terminal Q1 of the first flip-flop 236 at the first time point t. As a result, the second flip-flop 238 may delay the clock enable signal CLK_EN, e.g., by a time between a rising edge of the clock enable signal CLK_EN and the rising edge of the inverted PLL clock PLL_CLKB. Further, the delayed clock enable signal CLK_EN may be output from the first output terminal Q1 of the first flip-flop 236 to the second input terminal D2 of the second flip-flop 238 at the first time point t1.

When the inverted PLL clock PLL_CLKB has a rising edge at a second time point t2, the delayed clock enable signal CLK_EN input to the second input terminal D2 of the second flip-flop 238 may be transmitted to the second output terminal Q2 of the second flip-flop 238. Thus, the delayed clock enable signal CLK_EN may be further delayed, e.g., by a clock cycle of the inverted PLL clock PLL_CLKB. The further delayed clock enable signal CLK_EN may be output to the selection terminal S0 from the second output terminal Q2.

For example, when the clock enable signal CLK_EN is a logic high, the PLL clock PLL_CLK may have a falling edge at a rising edge of the inverted PLL clock PLL_CLKB. Thus, the clock enable signal CLK_EN with a logic high may be output to the selection terminal S0 as an selection signal at the rising edge of the inverted PLL clock PLL_CLKB. At this time, the PLL clock PLL_CLK may be output as an output clock CLK_OUT to the final output terminal Y of the selector 232, and the output clock CLK_OUT from which glitches are removed may be output, thereby preventing malfunction of an image device due to glitches, e.g., the first glitch in FIG. 5. Similarly, glitches, e.g., the second glitch in FIG. 5, may be removed when the clock enable signal CLK_EN is changed from a logic high to a logic low after the first time point t1. Alternatively, the selection signal at the selection terminal S0 may have a rising edge at the second time point t2 without a delay time from the rising edge of the inverted PLL clock PLL_CLKB, e.g., between the second time point t2 and the third time point t3, and may have a falling edge at a fifth time point t5 without a delay time from the rising edge of the inverted PLL clock PLL_CLKB, e.g., between the fifth time point t5 and a sixth time point t6.

Referring back to FIG. 3, According to some embodiments, the clock generator 260 of the image device may transmit the output clock CLK_OUT to the first interface 210 via the clock gating unit 230 which receives the PLL clock PLL_CLK received from the PLL circuit 220. The first interface 210 may receive parallel data from the link layer 240, convert the parallel data into serial data, and transmit the serial data to the second interface 110. A flowchart of an operating method of the image device described above is illustrated in FIG. 8.

Referring to FIGS. 3 and 8, the detection unit 120 may sense whether there is a frequency collision between a first bandwidth at which a peripheral device (e.g., a GPS or an RF device) operates and a first frequency used for data transmission between the image sensor 200 and the application processor (AP) 100. When frequency collision is sensed by the detection unit 120 (operation S500), the detection unit 120 may transmit a collision avoidance command CMD to the frequency changing unit 250 (operation S512). For example, the detection unit 120 may transmit the collision avoidance command CMD to change the first frequency to a second frequency that is different from the first frequency. Thus, the second frequency may not collide with the first bandwidth. When receiving the collision avoidance command CMD from the detection unit 120, the frequency changing unit 250 may transmit a frequency change command CH_CMD including sequence information for changing the first frequency to the second frequency to the link layer 240 (operation S520). The link layer 240 may transmit a control signal to the clock generator 260 to generate an output clock CLK_OUT operating at the second frequency by the clock generator 260. The control signal may include a frequency division control signal PLL_M and a clock enable signal CLK_EN. The frequency division control signal PLL_M may change a frequency division ratio of the main frequency divider of the PLL circuit 220 such that an output frequency of the PLL clock PLL_CLK may be changed from the first frequency to the second frequency. The clock enable signal CLK_EN may be transmitted to the clock gating unit 230 so that one of the PLL clock PLL_CLK and a ground signal from a ground terminal may be selected and output as the output clock CLK_OUT based on the clock enable signal CLK_EN. The clock generator 260 may transmit the output clock CLK_OUT with the second frequency to the first interface 210 (operation S540).

Figure 9:
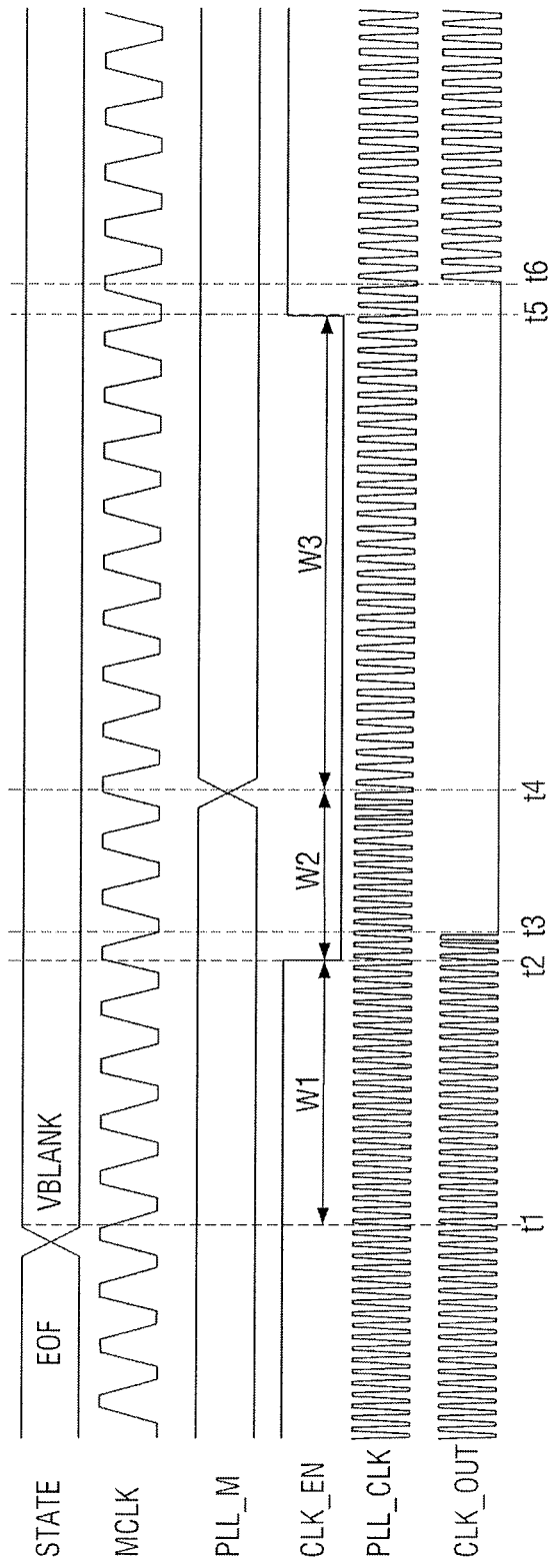
FIG. 9 illustrates a timing chart for explaining an operating method of an image device according to an example embodiment.

Sequence information configured by a frequency changing unit of an image device to change a frequency for communication between an image sensor and an application processor (AP) according to some embodiments will be described with reference to a timing diagram in FIG. 9 below. FIG. 9 illustrates a timing chart for explaining an operating method of an image device according to an embodiment.

Referring to FIGS. 3 and 9, the link layer 240 may transmit parallel data containing frame information to the first interface 210. Alternatively, the link layer 240 may have a vertical blanking time VBLANK to smoothly output an image. The vertical blanking time VBLANK may be after the end of frame (EOF). Further, the vertical blanking time VBLANK may be sufficiently maintained after the first time point t1 to completely update the first parallel data containing the frame information before the first parallel data is transmitted to the first interface 210.

A reference frequency generation signal MCLK for generating a PLL circuit reference frequency of the PLL circuit 220 may be continuously transmitted from the link layer 240 to the PLL circuit 220 for the vertical blanking time VBLANK from the end of frame EOF. The detection unit 120 may receive information of a first bandwidth from a peripheral circuit that operates at the first bandwidth and compare the information of the first bandwidth with information of the first frequency for communication between the image sensor 200 and the application processor (AP) 100. Thus, the detection unit may sense whether frequency collision between the first bandwidth and the first frequency occurs based on the information of the first bandwidth and the first frequency.

When the detection unit 120 senses frequency collision between the first bandwidth and the first frequency, the detection unit 120 may transmit a collision avoidance command CMD to the frequency changing unit 250. The detection unit 120 may include information regarding a second frequency that does not collide with the first bandwidth in the collision avoidance command CMD and transmit the collision avoidance command CMD to the frequency changing unit 250.

The frequency changing unit 250 may transmit a frequency change command CH_CMD containing certain sequence information to the link layer 240 such that the first frequency may be changed to the second frequency. According to the sequence information, the clock enable signal CLK_EN may be changed to a logic low, i.e., may be deactivated, at a second time point t2 when is later than the first time point t1 by a first period W1.

The first period W1 may be determined based on delays during communication between the first interface 210 of the image sensor 200 and the second interface 110 of the application processor (AP) 100. For example, when the link layer 240 is operated by a first word clock, the first period W1 may be 30 times of a clock cycle of the first word clock. The first period W1 may be a margin time for the application processor (AP) 100 to arrange a plurality of pieces of serial data and stably enter the vertical blanking time VBLANK. The first period W1 may have a different time from 30 times of the clock cycle of the first word clock as long as the margin time for the application processor (AP) 100 to stably enter the vertical blanking time VBLANK is satisfied.

At the second time point t2, the clock enable signal CLK_EN may be deactivated to change the first frequency of the PLL clock PLL_CLK output from the PLL circuit 220 to the second frequency. For example, the first frequency of the PLL clock PLL_CLK may be changed by adjusting the frequency division ratio of the main frequency divider of the phase-locked loop (PLL) circuit 220 based on the frequency division control signal PLL_M received from the link layer 240. Further, the frequency division control signal PLL_M may be transmitted to adjust the frequency division ratio of the main frequency divider at a fourth time point t4 when is later than the second time point t2 by a second period W2.

For example, when the first frequency of the PLL clock PLL_CLK starts to change to the second frequency, the PLL clock PLL_CLK may become unstable. Thus, the clock enable signal CLK_EN may be deactivated before and after the fourth time point t4, e.g., when the first frequency of the PLL clock PLL_CLK is changed to the second frequency. Further, the output clock CLK_OUT, which is a final signal output via the clock generator 260 and is delayed from the clock enable signal CLK_EN, may be a logic low and deactivated when the first frequency of the PLL clock PLL_CLK is changed to the second frequency. The clock generator 260 may output the PLL clock PLL_CLK received from the PLL circuit 220 as the output clock CLK_OUT. However, when the output clock CLK_OUT is not deactivated during a frequency change period of the PLL clock PLL_CLK, the communication between the image sensor 200 and the application processor (AP) 100 may be unstable. For example, when the PLL clock PLL_CLK is unstable during the frequency change period of the PLL clock PLL_CLK, parallel data and serial data which are synchronized with the PLL clock PLL_CLK may be unstable and thus a data transmission operation of the image device may be unstable.

As described above, the output clock CLK_OUT output via the clock generator 260 may be stable after the changing of the first frequency to the second frequency. Thus, the PLL clock PLL_CLK may be output as the output clock CLK_OUT by deactivating the clock enable signal CLK_EN in advance at the second time point t2 when is earlier than the fourth time point 14 by the second period W2 and by changing the clock enable signal CLK_EN to a logic high, i.e., by activating the clock enable signal CLK_EN, at a fifth time point t5 when is later than the fourth time point t4 by a third period W3.

According to some embodiments, image devices may have the third period W3 of, e.g., 75 microseconds or more. A method of removing glitches during stopping of the PLL clock PLL_CLK based on the clock enable signal CLK_EN input to the clock gating unit 230 is as described above with reference to FIGS. 4 to 7 and thus a description thereof is omitted here.

Thus, the first frequency at which the image sensor 200 and the application processor (AP) 100 operate may be changed to the second frequency during a vertical blanking time based on the sequence information contained in the frequency change command CH_CMD generated by the frequency changing unit 250. Thus, frequency changing of the a PLL circuit may be performed without resetting the PLL circuit, and thus a user may use an electronic device including an image device in real time without experiencing malfunction of the image device.

FIGS. 10 to 16 illustrate image devices according to other embodiments. An operating method of the image sensors is substantially the same as that described above with reference to FIGS. 3 to 9, and thus, a description will be focused on structural differences.

Figure 10:
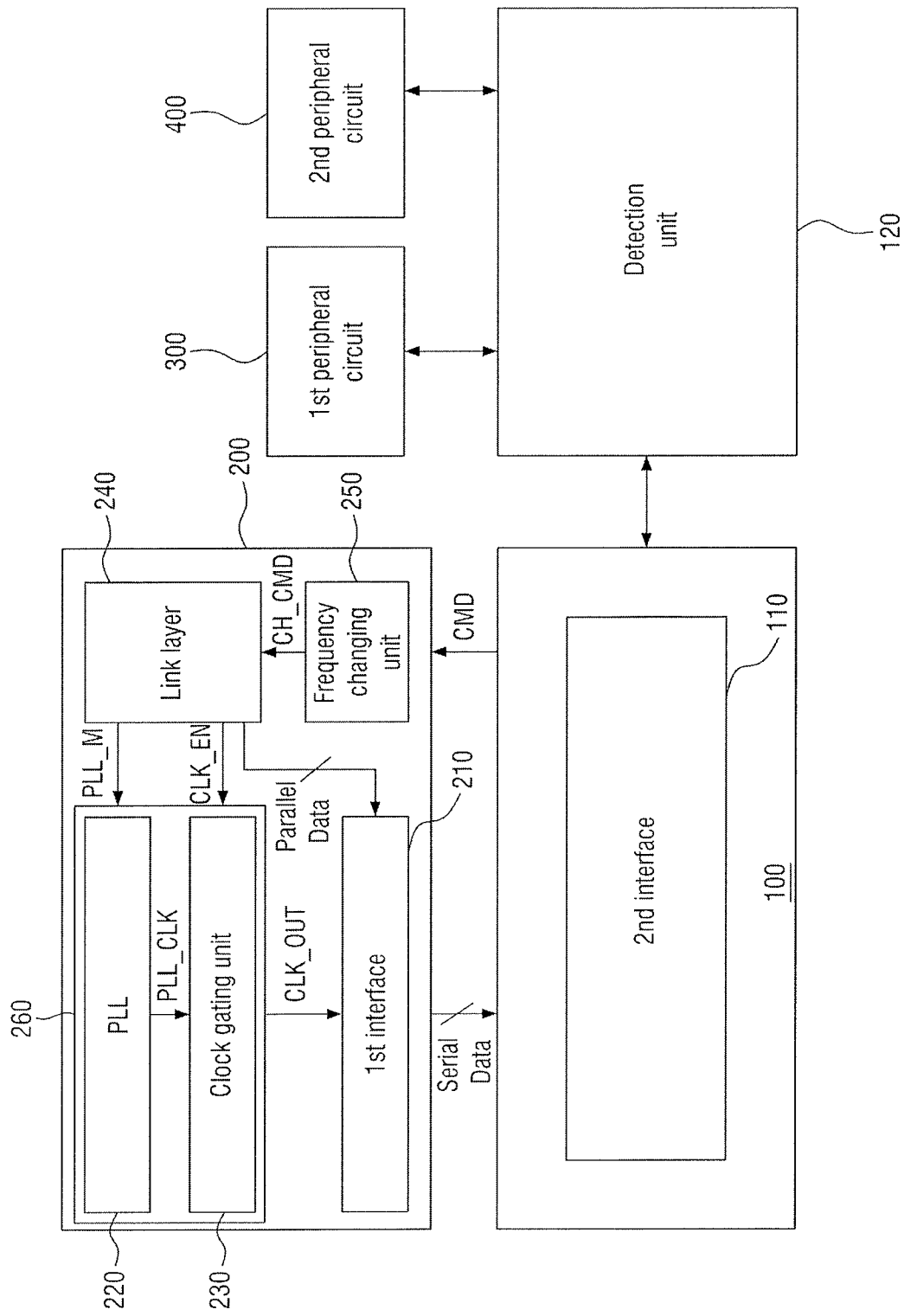
FIGS. 10 to 16 illustrate image devices according to some embodiments.

Referring to FIG. 10, a detection unit 120 may be provided outside an application processor (AP) 100 unlike FIG. 3. For example, the detection unit 120 may receive information regarding a first bandwidth at which a first peripheral circuit 300 operates and a first frequency at which an image sensor 200 and an application processor (AP) 100 communicate with each other. The detection unit 120 may sense whether there is frequency collision between the first bandwidth and the first frequency. When frequency collision is sensed, the detection unit 120 may transmit information regarding the sensed frequency collision to the application processor (AP) 100. The application processor (AP) 100 may transmit a collision avoidance command CMD to a frequency changing unit 250 to change the first frequency to a second frequency that does not collide or overlap with the first bandwidth.

Figure 11:
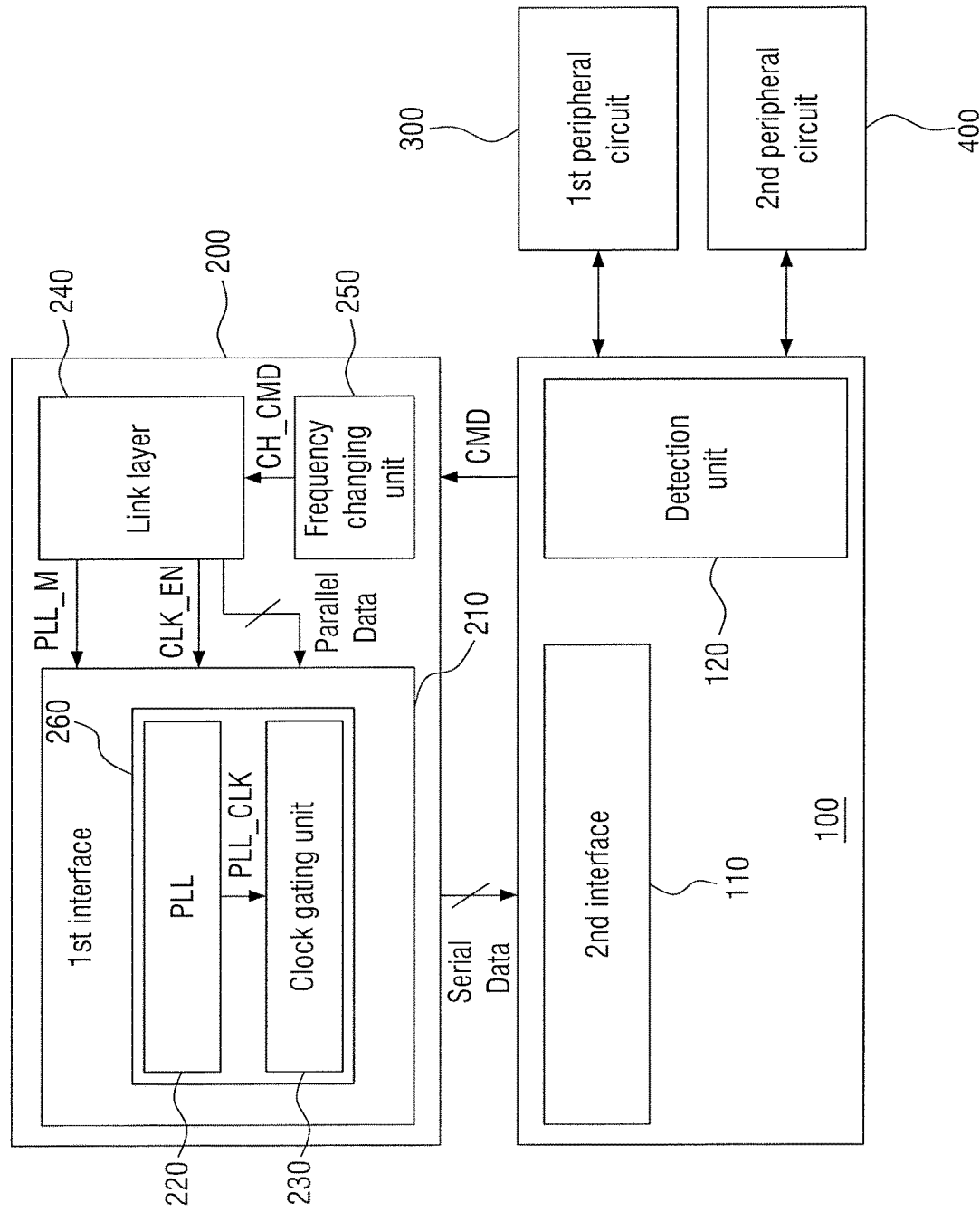
Figure 12:
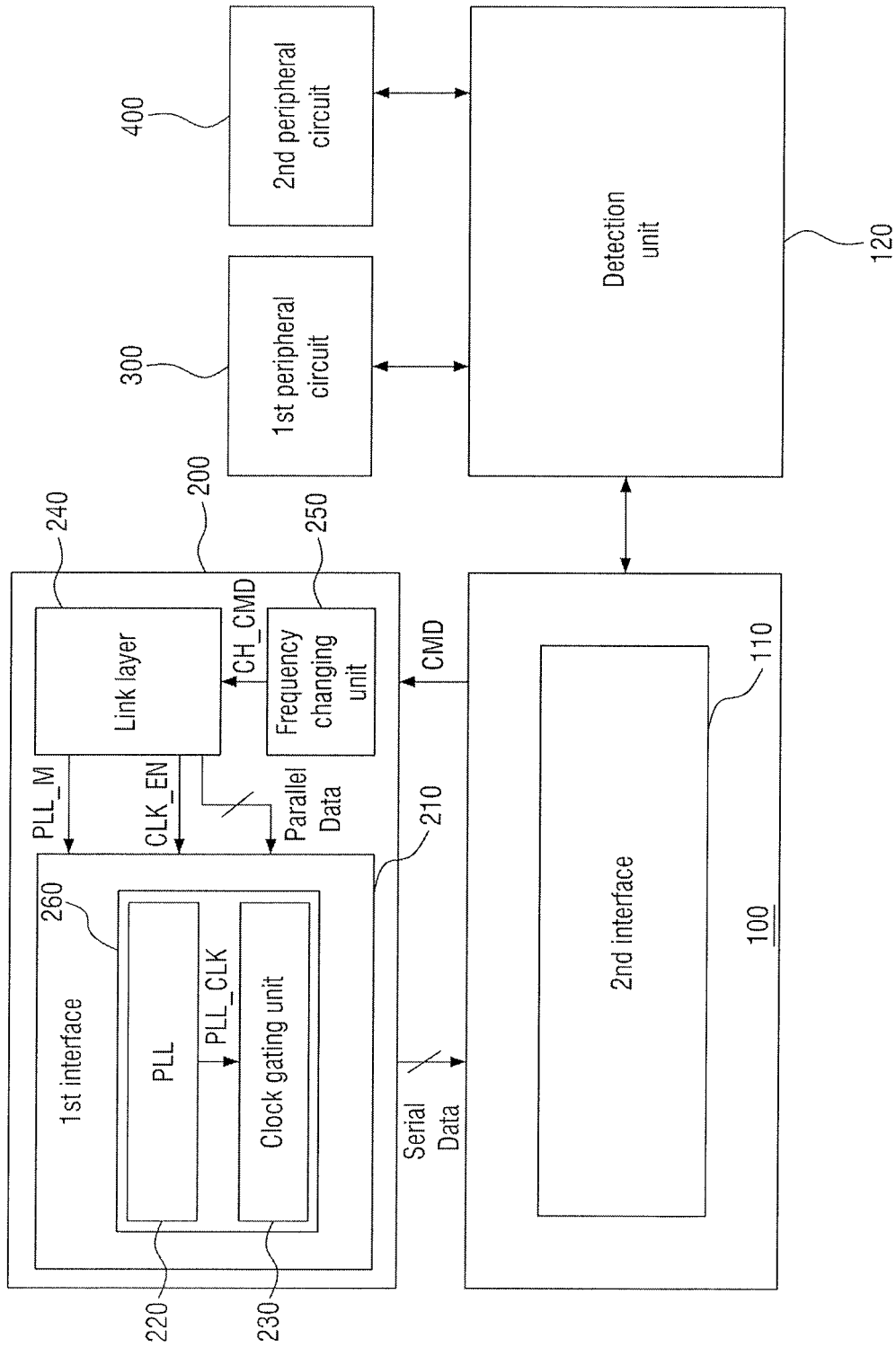
Figure 13:
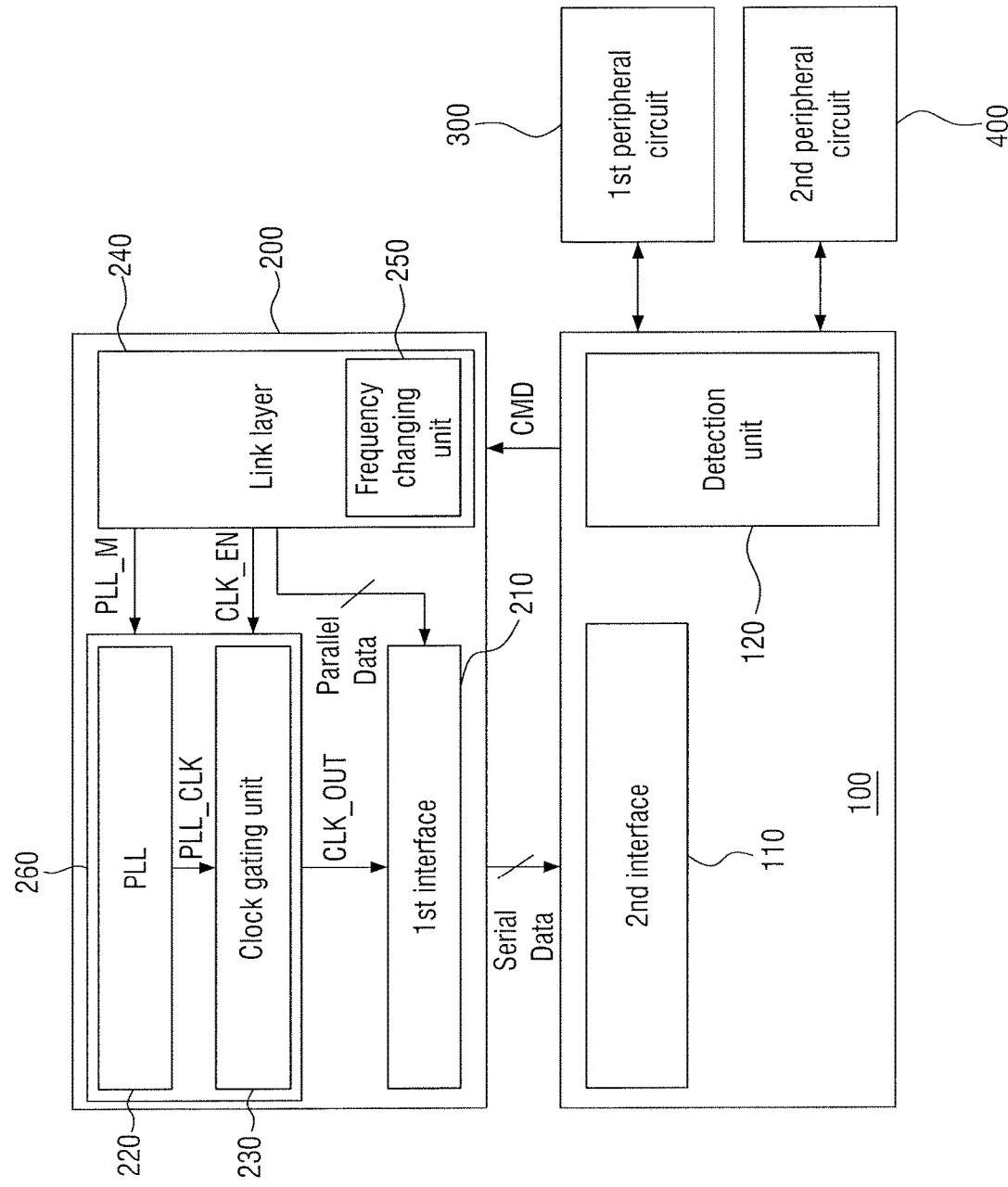
Figure 14:
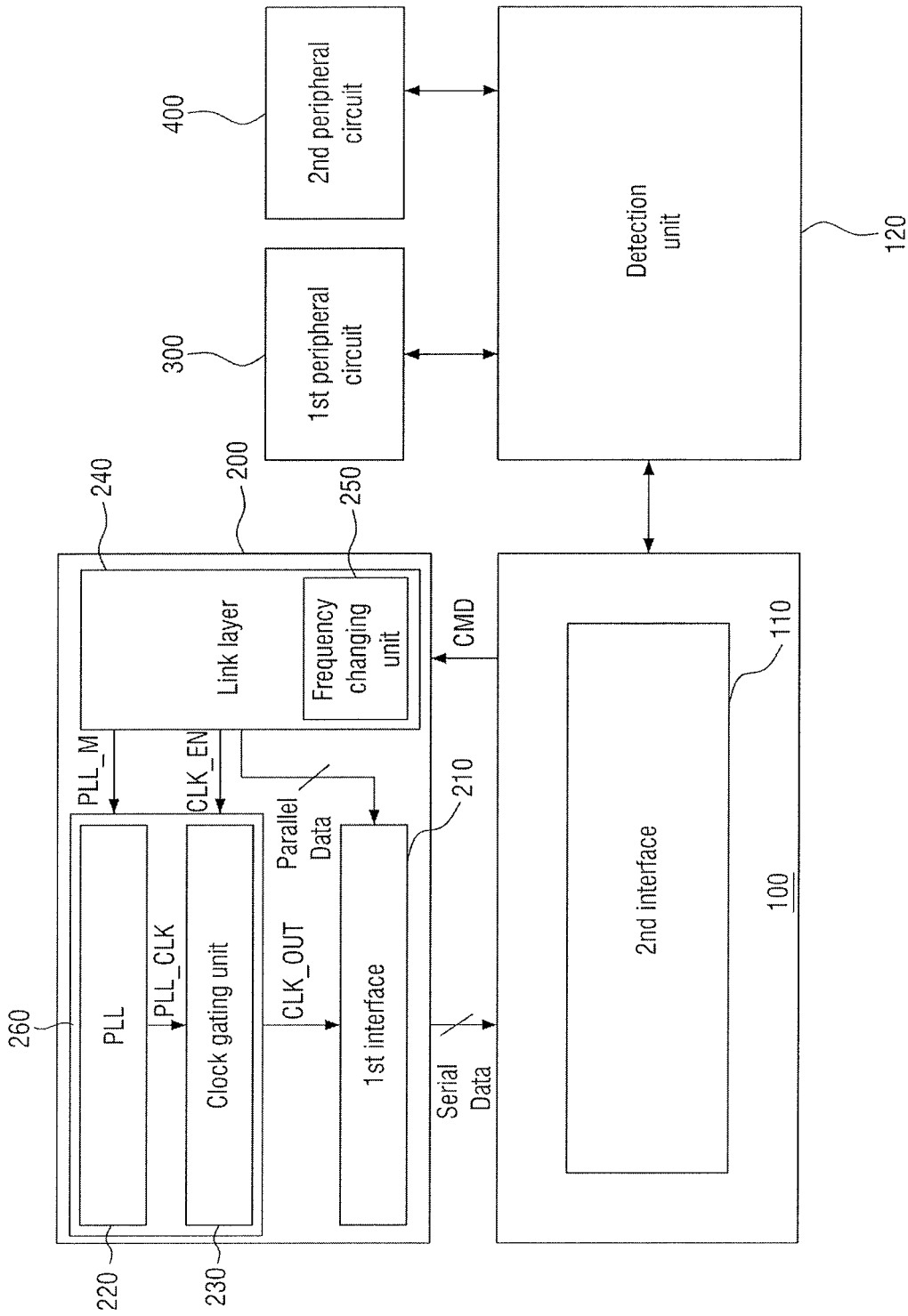
Figure 15:
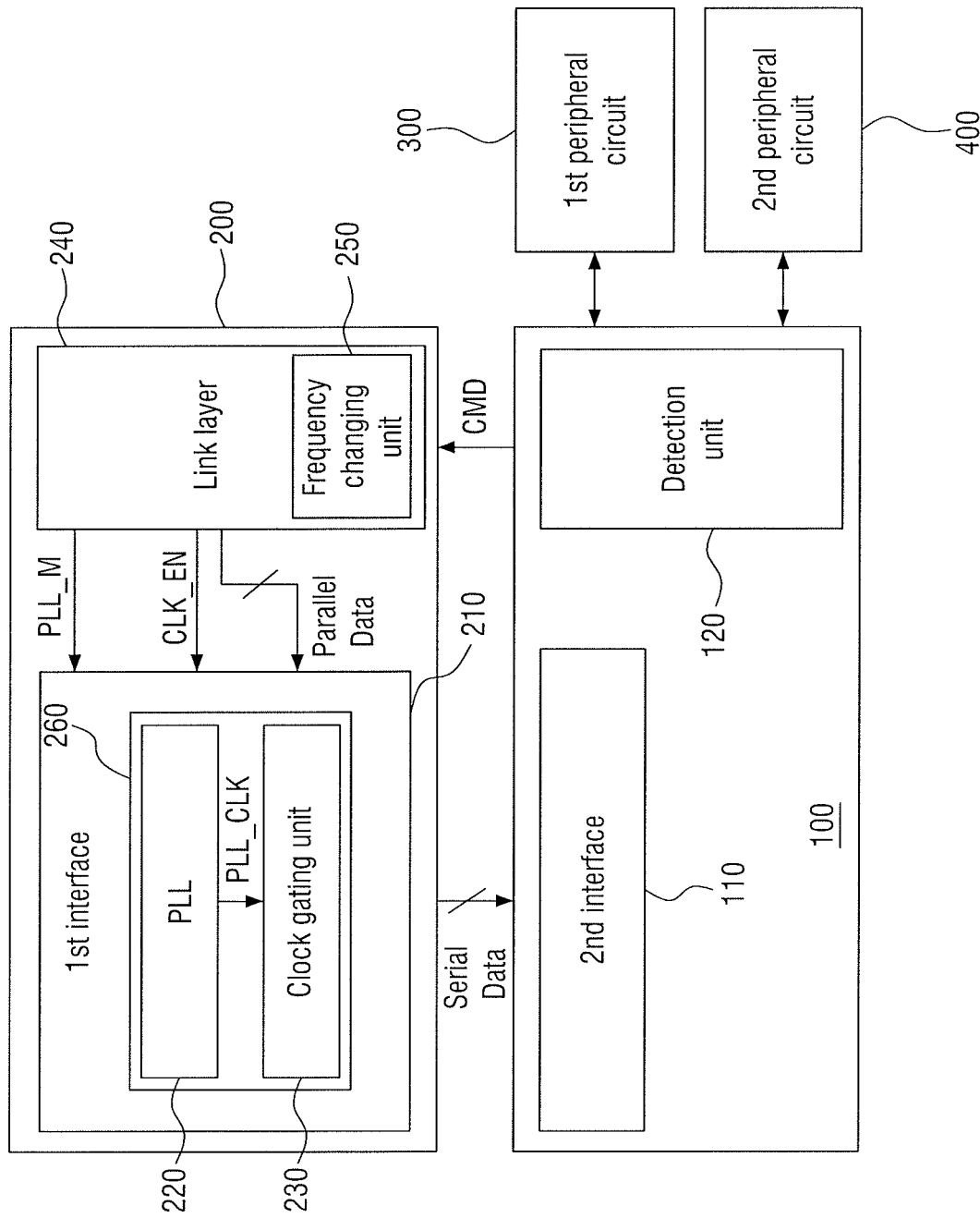
Figure 16:
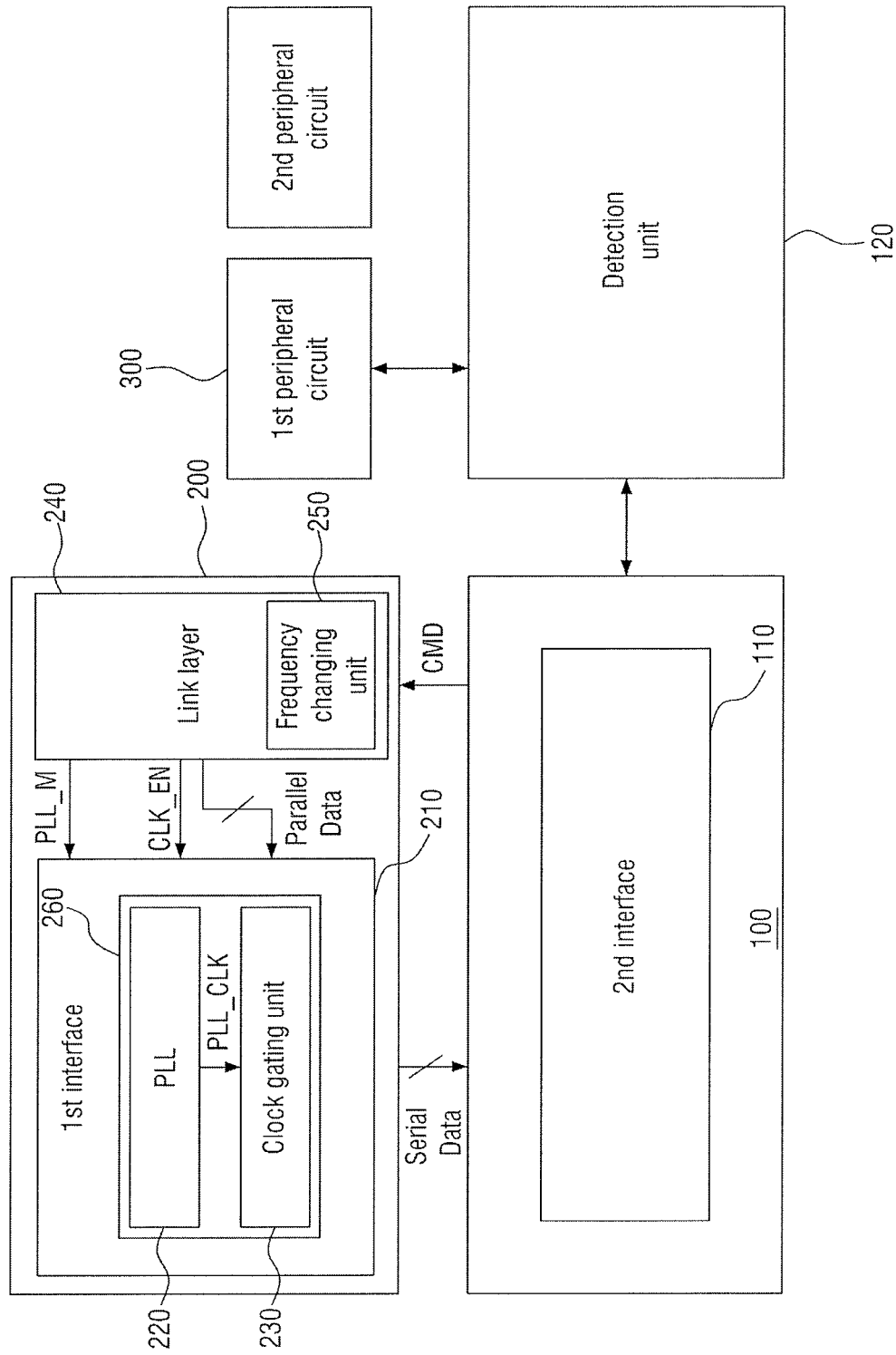

Referring to FIG. 11, the image device is substantially the same as that in FIG. 3 in terms of a structure and an operating method, except that a clock generator 260 is included in a first interface 210. Referring to FIG. 12, the image device is substantially the same as that in FIG. 3 in terms of a structure and an operating method, except that a detection unit 120 is provided outside an application processor (AP) 100 and a clock generator 260 is included in a first interface 210. Referring to FIG. 13, the image sensor is substantially the same as that in FIG. 3 in terms of a structure and an operating method, except that a frequency changing unit 250 is included in a link layer 240. Referring to FIG. 14, the image sensor is substantially the same as that in FIG. 3 in terms of a structure and an operating method, except that a frequency changing unit 250 is included in a link layer 240 and a detection unit 120 is provided outside an application processor (AP) 100. Referring to FIG. 15, the image sensor is substantially the same as that in FIG. 3 in terms of a structure and an operating method, except that a frequency changing unit 250 is included in a link layer 240 and a clock generator 260 is included in a first interface 210. Referring to FIG. 16, the image sensor is substantially the same as that in FIG. 3 in terms of a structure and an operating method, except that a frequency changing unit 250 is included in a link layer 240 and a detection unit 120 is provided outside an application processor (AP) 100.

Various operations of methods described above may be performed as is suitable, such as by various hardware and/or software components, modules, and/or circuits. When implemented in software, the operations may be implemented using, for example, an ordered listing of executable instructions for implementing logical functions, and may be embodied in a processor-readable medium for use by or in connection with an instruction execution system, apparatus, or device, such as a single or multiple-core processor or processor-containing system.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium. A software module may reside in, for example, Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other suitable form of storage medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image device, comprising:
a clock generator to generate a first output clock of a first frequency;
a link layer circuit to generate a control signal for changing the first frequency and output first parallel data including first frame information;
a detector to generate a collision avoidance command to change the first frequency to a second frequency during a vertical blanking time, the second frequency being different from the first frequency; and
a frequency changing circuit to receive the collision avoidance command from the detector and transmit a frequency change command to the link layer circuit, wherein:
the link layer circuit transmits the control signal to the clock generator based on the frequency change command, and
the vertical blanking time is a time period from a first time point at which the first parallel data is not output from the link layer circuit to a second time point at which second parallel data is output, the second parallel data including second frame information subsequent to the first frame information.

2. The image device as claimed in claim 1, wherein the clock generator includes a phase-locked loop (PLL) circuit and a clock gating circuit, and wherein:
the PLL circuit generates a first PLL clock of the first frequency, and
the clock gating circuit generates the first output clock by controlling output of the first PLL clock.

3. The image device as claimed in claim 2, wherein the control signal includes a frequency division control signal and a clock enable signal, and wherein:
the frequency division control signal changes the first frequency of the first PLL clock to the second frequency, and when the clock enable signal is deactivated, the first PLL clock is blocked by the clock gating circuit such that the first output clock is not output.

4. The image device as claimed in claim 3, wherein the clock gating circuit includes an inverter, a selector, a first flip-flop, and a second flip-flop, wherein:
the inverter receives the first PLL clock and outputs an inverted first PLL clock,
the first flip-flop receives the clock enable signal via a first input terminal of the first flip-flop and receives the inverted first PLL clock via a second input terminal of the first flip-flop,
the second flip-flop includes a third input terminal connected to a first output terminal of the first flip-flop, receives the inverted first PLL clock via a fourth input terminal of the second flip-flop, and outputs a selection signal via a third output terminal of the second flip-flop, and
the selector receives the first PLL clock via a first input selection terminal of the selector, receives a ground voltage via a second input selection terminal of the selector, selects one of the first PLL clock and the ground voltage, and outputs the selected one as the first output clock.

5. The image device as claimed in claim 3, wherein:
the clock enable signal is deactivated at the second time point when is later than the first time point by a first period,
the frequency division control signal changes the first frequency of the first PLL clock at a third time point when is later than the second time point by a second period, and
the clock enable signal is activated at a fourth time point when is later than the third time point by a third period.

6. The image device as claimed in claim 5, wherein:
the link layer circuit is operated based on a first word clock, and
the first period is thirty times of a clock cycle of the first word clock.

7. The image device as claimed in claim 5, wherein the third period is 75 microseconds or more.

8. The image device as claimed in claim 1, further comprising a first peripheral circuit to operate in a first bandwidth, wherein
the detector senses whether there is frequency collision between the first frequency and the first bandwidth and transmits the collision avoidance command to the frequency changing circuit when the frequency collision is sensed.

9. The image device as claimed in claim 8, wherein the second frequency does not collide with the first bandwidth.

10. An image device, comprising:
a detector to generate a collision avoidance command;
a frequency changing circuit to receive the collision avoidance command from the detector and generate a frequency change command;
a link layer circuit to receive the frequency change command from the frequency changing circuit, generate a control signal based on the frequency change command, and output first parallel data including first frame information; and
a clock generator to receive the control signal from the link layer circuit and generate a first output clock of a first frequency, wherein:
the first frequency is changed to a second frequency during a vertical blanking time, the second frequency being different from the first frequency, and the vertical blanking time is a time period from a first time point at which the first parallel data is not output from the link layer circuit to a second time point at which second parallel data is output, the second parallel data including second frame information subsequent to the first frame information.

11. The image device as claimed in claim 10, wherein the clock generator includes a phase-locked loop (PLL) circuit and a clock gating circuit, wherein:
the PLL circuit generates a first PLL clock of the first frequency,
the clock gating circuit generates the first output clock by controlling output of the first PLL clock, and
the control signal includes a frequency division control signal and a clock enable signal, and wherein:
the frequency division control signal changes the first frequency of the first PLL clock, and
when the clock enable signal is deactivated, the first PLL clock is blocked by the clock gating circuit such that the first output clock is not output.

12. The image device as claimed in claim 11, wherein the clock gating circuit includes an inverter, a selector, a first flip-flop, and a second flip-flop, and wherein:
the inverter receives the first PLL clock and outputs an inverted first PLL clock,
the first flip-flop receives the clock enable signal via a first input terminal of the first flip-flop and receives the inverted first PLL clock via a second input terminal of the first flip-flop,
the second flip-flop includes a third input terminal connected to a first output terminal of the first flip-flop, receives the inverted first PLL clock via a fourth input terminal of the second flip-flop, and outputs a selection signal via a third output terminal of the second flip-flop, and
the selector receives the first PLL clock via a first input selection terminal, receives a ground voltage via a second input selection terminal of the selector, and selects one of the first PLL clock and the ground voltage, and outputs the selected one as the first output clock.

13. The image device as claimed in claim 11, wherein the clock enable signal is deactivated at a second time point when is later than the first time point by a first period, and
the frequency division control signal changes the first frequency of the first PLL clock at a third time point when is later than the second time point by a second period, and
the clock enable signal is activated at a fourth time point when is later than the third time point by a third period.

14. The image device as claimed in claim 13, wherein:
the link layer circuit is operated based on a first word clock, and
the first period is thirty times of a clock cycle of the first word clock.

15. The image device as claimed in claim 13, wherein the third period is 75 microseconds or more.

16. The image device as claimed in claim 10, further comprising a first peripheral circuit to operate at a first bandwidth, wherein:
the detector senses whether there is frequency collision between the first frequency and the first bandwidth, and transmits the collision avoidance command to the frequency changing circuit when the frequency collision is sensed, and
the second frequency does not collide with the first bandwidth.

17. An image device, comprising:
a link layer circuit to generate first parallel data including first frame information, the first parallel data being not generated from a first time point;
a first peripheral circuit to operate at a first bandwidth;
a clock generator to generate a first output clock of a first frequency;
a detector to sense whether there is frequency collision between the first bandwidth and the first frequency and generate a collision avoidance command when the frequency collision is sensed; and
a frequency changing circuit to receive the collision avoidance command from the detector and generate a frequency change command to change the first frequency to a second frequency after the first time point, the second frequency not colliding with the first bandwidth.

18. The image device as claimed in claim 17, wherein the clock generator includes a phase-locked loop (PLL) circuit and a clock gating circuit, wherein:
the PLL circuit generates a first PLL clock operating at the first frequency,
the clock gating circuit generates the first output clock by controlling output of the first PLL clock, and
the link layer circuit generates a control signal, the control signal including a frequency division control signal and a clock enable signal, wherein:
when the clock enable signal is deactivated, the first PLL clock is blocked by the clock gating circuit such that the first output clock is not output at a second time point when is later than the first time point by a first period, and
the frequency division control signal changes the first frequency of the first PLL clock to the second frequency at a third time point when is later than the second time point by a second period.

19. The image device as claimed in claim 18, wherein:
the link layer circuit is operated based on a first word clock,
the first period is thirty times of a clock cycle of the first word clock,
the clock enable signal is activated at a fourth time point when is later than the third time point by a third period, and
the third period is 75 microseconds or more.

20. The image device as claimed in claim 17, further comprising a first peripheral circuit to operate in a first bandwidth, wherein:
the detector senses whether there is frequency collision between the first frequency and the first bandwidth and transmits the collision avoidance command to the frequency changing circuit when the frequency collision is sensed,
the second frequency does not collide with the first bandwidth,
the clock generator includes a phase-locked loop (PLL) circuit and a clock gating circuit, and wherein:
the PLL circuit generates a first PLL clock operating at the first frequency,
the clock gating circuit generates the first output clock by controlling the first PLL clock,
the link layer circuit generates a control signal, the control signal including a frequency division control signal and a clock enable signal,
the clock enable signal is deactivated, the first PLL clock is blocked by the clock gating circuit such that the first output clock is not output at a second time point when is later than the first time point by a first period, and the frequency division control signal changes the first frequency of the first PLL clock to the second frequency at a third time point when is later than the second time point by a second period.

* * * * *